US012041819B2

(12) United States Patent
Chen

(10) Patent No.: US 12,041,819 B2
(45) Date of Patent: Jul. 16, 2024

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Bi Chen, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 716 days.

(21) Appl. No.: 17/266,971

(22) PCT Filed: Oct. 19, 2020

(86) PCT No.: PCT/CN2020/121851
§ 371 (c)(1),
(2) Date: Feb. 8, 2021

(87) PCT Pub. No.: WO2022/032863
PCT Pub. Date: Feb. 17, 2022

(65) Prior Publication Data
US 2022/0310731 A1    Sep. 29, 2022

(30) Foreign Application Priority Data

Aug. 12, 2020 (CN) .......................... 202010806896.8
Sep. 9, 2020 (CN) .......................... 202010938221.9

(51) Int. Cl.
H10K 59/121      (2023.01)
H01L 29/786      (2006.01)
H10K 59/131      (2023.01)

(52) U.S. Cl.
CPC ... *H10K 59/1213* (2023.02); *H01L 29/78672* (2013.01); *H01L 29/7869* (2013.01);
(Continued)

(58) Field of Classification Search
CPC ............. H10K 59/1213; H10K 59/131; H10K 59/1216; H01L 29/78672; H01L 29/7869; H01L 29/78696
See application file for complete search history.

(56) References Cited

U.S. PATENT DOCUMENTS

2006/0066644 A1    3/2006    Yamaguchi
2016/0293269 A1    10/2016   Lim
(Continued)

FOREIGN PATENT DOCUMENTS

CN    1716609 A      1/2006
CN    102969361 A    3/2013
(Continued)

OTHER PUBLICATIONS

International Search Report in International application No. PCT/CN2020/121851, dated Apr. 27, 2021.
(Continued)

*Primary Examiner* — Patrick N Edouard
*Assistant Examiner* — Eboni N Giles
(74) *Attorney, Agent, or Firm* — PV IP PC; Wei Te Chung; Zhigang Ma

(57) ABSTRACT

A display panel and a display device are provided. The display panel includes a plurality of light-emitting devices and a pixel driving circuit for driving the light-emitting devices to emit light. By using oxide transistors as a compensation transistor, first initialization transistor, and second initialization transistor in the pixel driving circuit, and using low-temperature polysilicon transistors as other transistors, both low leakage current characteristics of the oxide tran-
(Continued)

sistors and high mobility characteristics of the low-temperature polysilicon transistors can be achieved, making the circuit more stable.

14 Claims, 9 Drawing Sheets

(52) U.S. Cl.
CPC ... H01L 29/78696 (2013.01); H10K 59/1216 (2023.02); H10K 59/131 (2023.02)

(56) References Cited

U.S. PATENT DOCUMENTS

| | | | |
|---|---|---|---|
| 2018/0350891 A1* | 12/2018 | Kim | H01L 27/124 |
| 2019/0073957 A1 | 3/2019 | Yang et al. | |
| 2022/0310017 A1* | 9/2022 | Yang | G09G 3/3241 |
| 2022/0310184 A1* | 9/2022 | Zhang | H01L 27/124 |
| 2022/0415933 A1* | 12/2022 | Liu | G02F 1/1368 |
| 2023/0306911 A1* | 9/2023 | Zheng | G09G 3/3291 |

FOREIGN PATENT DOCUMENTS

| | | |
|---|---|---|
| CN | 104064688 A | 9/2014 |
| CN | 106164763 A | 11/2016 |
| CN | 106940983 A | 7/2017 |
| CN | 108281114 A | 7/2018 |
| CN | 108987438 A | 12/2018 |
| CN | 110648629 A | 1/2020 |
| CN | 111369943 A | 7/2020 |
| CN | 111445854 A | 7/2020 |
| JP | 2019070817 A | 5/2019 |
| WO | 2006075601 A1 | 7/2006 |

OTHER PUBLICATIONS

Written Opinion of the International Searching Authority in International application No. PCT/CN2020/121851, dated Apr. 27, 2021.
Chinese Office Action issued in corresponding Chinese Patent Application No. 202010938221.9 dated Apr. 29, 2021, pp. 1-14.

* cited by examiner

700

DISPLAY PANEL AND DISPLAY DEVICE

RELATED APPLICATIONS

This application is a Notional Phase of PCT Patent Application No. PCT/CN2020/121851 having international filing date of Oct. 19, 2020, which claims the benefit of priority of Chinese Patent Application Nos. 202010938221.9 filed on Sep. 9, 2020 and 202010806896.8 filed on Aug. 12, 2020. The contents of the above applications are all incorporated by reference as if fully set forth herein in their entirety.

FIELD OF INVENTION

The application relates to the field of display technology, and in particular to a display panel and a display device.

BACKGROUND OF INVENTION

Since polysilicon thin-film transistors have high mobility, low-temperature polysilicon (LTPS) thin-film transistors are usually used to drive pixels to emit light in pixel driving circuits of current organic light-emitting diode (OLED) display panels. However, the OLED display panels using low-temperature polysilicon thin-film transistors have a problem of poorer stability in a light-emitting phase at a lower refresh frequency, resulting in poor display effect.

Therefore, the current display panels have a technical problem of poorer stability of the pixel driving circuit, which needs to be resolved.

Technical Problem

Embodiments of the present application provide a display panel and a display device to alleviate the technical problem of poor stability of the pixel driving circuit in the current display panel.

SUMMARY OF INVENTION

To solve the above problems, the technical solutions provided by the application are as follows:

The present application provides a display panel, including a plurality of light-emitting devices arranged in an array and a pixel driving circuit for driving the light-emitting devices to emit light, and the pixel driving circuit includes: a first initialization transistor configured to input an initialization signal to a first node under control of a first scan signal; a switching transistor configured to input a data signal to a second node under control of a second scan signal; a driving transistor configured to drive the light-emitting device to emit light under control of potentials of the first node and the second node; a compensation transistor connected to the driving transistor through the first node and a third node, and configured to compensate a threshold voltage of the driving transistor under control of a third scan signal; a second initialization transistor configured to input an initialization signal to an anode of the light-emitting device under control of the third scan signal; a first light-emitting control transistor connected to the driving transistor through the second node, and configured to conduct a current from a power supply high-potential signal line to the driving transistor under control of a light-emitting control signal; a second light-emitting control transistor connected to the driving transistor through the third node, and configured to conduct a current from the driving transistor to the anode of the light-emitting device under control of the light-emitting control signal; and a storage capacitor, connected to the driving transistor through the first node, connected to the power supply high-potential signal line through a fourth node, and configured to store the data signal; wherein the compensation transistor, the first initialization transistor, and the second initialization transistor are oxide transistors, and the switching transistor, the driving transistor, the first light-emitting control transistor, and the second light-emitting control transistor are low-temperature poly silicon transistors.

In the display panel of the application, the compensation transistor, the first initialization transistor, and the second initialization transistor are N-type transistors, and the switching transistor, the driving transistor, the first light-emitting control transistor, and the second light-emitting control transistor are P-type transistors.

In the display panel of the present application, the display panel includes a substrate, a first semiconductor layer, a first metal layer, a second metal layer, a second semiconductor layer, a third metal layer, a first source-drain layer, and a second source-drain layer, stacked from bottom to top, the first semiconductor layer forms polysilicon active layers of each low-temperature polysilicon transistor, and the second semiconductor layer forms oxide active layers of each of oxide transistors.

In the display panel of the present application, a projection of the poly silicon active layer on the substrate at least partially overlaps a projection of the oxide active layer on the substrate.

In the display panel of the present application, the first metal layer is patterned to form a top gate of each of the oxide transistors, and the oxide active layer forms a channel region of each of the oxide transistors, the second metal layer is patterned to form a bottom gate of each of the oxide transistors, and a projection of the channel region on the substrate falls within a projection range of a corresponding bottom gate on the substrate.

In the display panel of the present application, the first metal layer is patterned to form a first electrode plate of the storage capacitor, and the second metal layer is patterned to form a second electrode plate of the storage capacitor.

In the display panel of the present application, the first source-drain layer is patterned to form a power supply high-potential signal line, the second source-drain layer is patterned to form a first blocking member, the first blocking member is connected to the power supply high-potential signal line, and a projection of the first blocking member on the first metal layer covers at least a part of an area of the first electrode plate of the storage capacitor.

In the display panel of the present application, a projection of the first blocking member on the oxide active layer covers a channel region of the compensation transistor and a channel region of the first initialization transistor.

In the display panel of the present application, the second source-drain layer is patterned to form a second blocking member, the second blocking member is connected to the second light-emitting control transistor and the anode of the light-emitting device, and a projection of the oxide active layer covers a channel region of the second initialization transistor.

The application also provides a display device, including a first initialization transistor configured to input an initialization signal to a first node under control of a first scan signal; a switching transistor configured to input a data signal to a second node under control of a second scan signal; a driving transistor configured to drive the light-emitting device to emit light under control of potentials of the first node and the second node; a second initialization transistor configured to input an initialization signal to an anode of the light-emitting device under control of the third scan signal; wherein the first initialization transistor and the second initialization transistor are oxide transistors, and the switching transistor and the second initialization transistor are different types of transistors.

In the display device of the present application, the switching transistor is a low-temperature polysilicon transistor.

In the display device of the present application, the switching transistor is a P-type transistor, and the first initialization transistor and the second initialization transistor are N-type transistors.

In the display device of the present application, the display device includes a substrate, a first semiconductor layer, a first metal layer, a second metal layer, a second semiconductor layer, a third metal layer, a first source-drain layer, and a second source-drain layer, stacked from bottom to top, the first semiconductor layer forms polysilicon active layers of low-temperature polysilicon transistors, and the second semiconductor layer forms oxide active layers of oxide transistors.

In the display device of the present application, a projection of the poly silicon active layer on the substrate at least partially overlaps a projection of the oxide active layer on the substrate.

In the display device of the present application, the second metal layer is patterned to form a bottom gate of each of the oxide transistors, the third metal layer is patterned to form a top gate of each of the oxide transistors, the oxide active layer forms a channel region of each of the oxide transistors, and a projection of the channel region on the substrate falls within a projection range of a corresponding bottom gate on the substrate.

In the display device of the present application, the display device further includes a storage capacitor, the storage capacitor is connected to the driving transistor through the first node, is connected to the power supply high-potential signal line through a fourth node, and is configured to store the data signal, the first metal layer is patterned to form a first electrode plate of the storage capacitor, and the second metal layer is patterned to form a second electrode plate of the storage capacitor.

In the display device of the present application, the first source-drain layer is patterned to form a power supply high-potential signal line, the second source-drain layer is patterned to form a first blocking member, the first blocking member is connected to the power supply high-potential signal line, and a projection of the first blocking member on the first metal layer covers at least a part of an area of the first electrode plate of the storage capacitor.

In the display device of the present application, a projection of the first blocking member on the oxide active layer covers a channel region of the first initialization transistor.

In the display device of the present application, the display device further includes: a first light-emitting control transistor connected to the driving transistor through the second node, and configured to conduct a current from a power supply high-potential signal line to the driving transistor under control of a light-emitting control signal; and a second light-emitting control transistor connected to the driving transistor through the third node, and configured to conduct a current from the driving transistor to the anode of the light-emitting device under control of the light-emitting control signal; wherein the driving transistor, the first light-emitting control transistor, and the second light-emitting control transistor are polysilicon transistors.

In the display device of the present application, the second source-drain layer is patterned to form a second blocking member, the second blocking member is connected to the second light-emitting control transistor and the anode of the light-emitting device, and a projection of the oxide active layer covers a channel region of the second initialization transistor.

In the display device of the present application, the display device further includes a compensation transistor, wherein the compensation transistor is connected to the driving transistor through the first node and the third node and configured to compensate a threshold voltage of the driving transistor under control of the third scan signal, and the compensation transistor is an oxide transistor.

In the display device of the present application, a projection of the first blocking member on the oxide active layer covers a channel region of the compensation transistor.

Beneficial Effect

The present application provides a display panel and a display device. The display panel includes a plurality of light-emitting devices arranged in an array and a pixel driving circuit that drives the light-emitting devices to emit light, and the pixel driving circuit includes: a first initialization transistor configured to input an initialization signal to a first node under control of a first scan signal; a switching transistor configured to input a data signal to a second node under control of a second scan signal; a driving transistor configured to drive the light-emitting device to emit light under control of potentials of the first node and the second node; a compensation transistor connected to the driving transistor through the first node and a third node, and configured to compensate a threshold voltage of the driving transistor under control of a third scan signal; a second initialization transistor configured to input an initialization signal to an anode of the light-emitting device under control of the third scan signal; a first light-emitting control transistor connected to the driving transistor through the second node, and configured to conduct a current from a power supply high-potential signal line to the driving transistor under control of a light-emitting control signal; a second light-emitting control transistor connected to the driving transistor through the third node, and configured to conduct a current from the driving transistor to the anode of the light-emitting device under control of the light-emitting control signal; a storage capacitor, connected to the driving transistor through the first node, connected to the power supply high-potential signal line through a fourth node, and configured to store the data signal; wherein the compensation transistor, the first initialization transistor, and the second initialization transistor are oxide transistors, and the switching transistor, the driving transistor, the first light-emitting control transistor, and the second light-emitting control transistor are low-temperature polysilicon transistors. In this application, by using oxide transistors as compensation transistor, first initialization transistor, and second initialization transistor in the pixel driving circuit, and using low-temperature polysilicon transistors as other transistors, both low leakage current characteristics of oxide transistors and high mobility characteristics of low-temperature polysilicon transistors can be achieved, so that the pixel driving circuit is more stable and the display effect of the display panel is improved.

DESCRIPTION OF DRAWINGS

In order to explain the embodiments in the present application or the technical solutions in the prior art more clearly, the following will briefly introduce drawings that need to be used in the description of the embodiments or in the prior art. Obviously, the drawings in the description are only some embodiments of the application. For those of ordinary skill in the art, other drawings can be obtained based on these drawings without doing creative work.

DETAILED DESCRIPTION OF PREFERRED EMBODIMENTS

Figure 1:
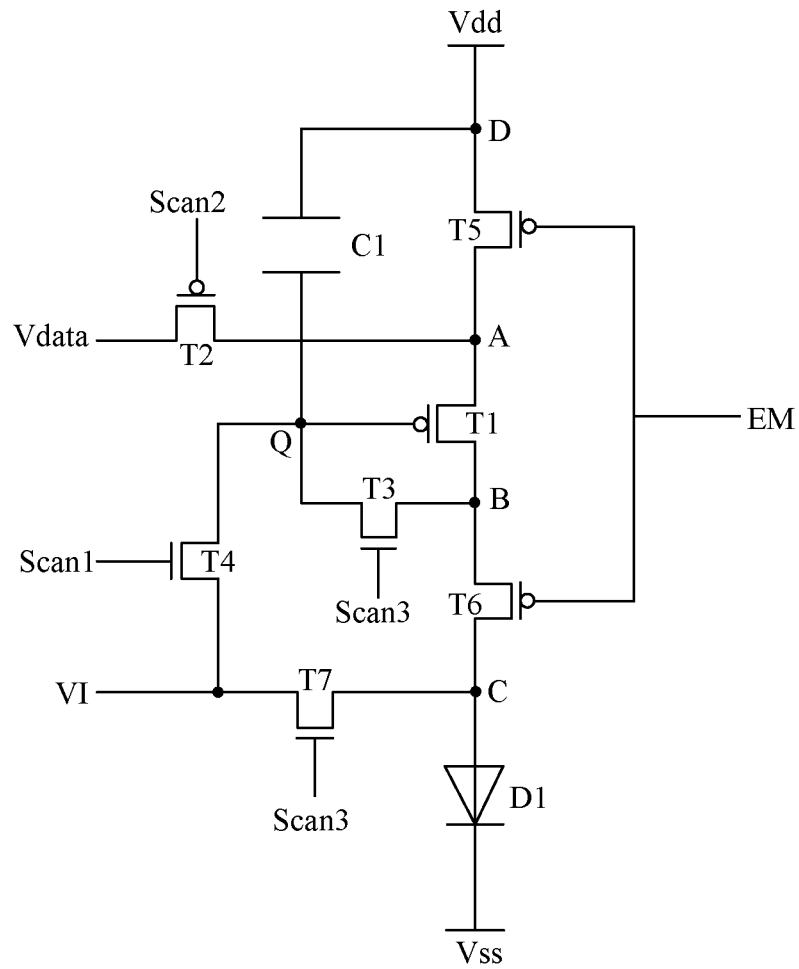
FIG. 1 is a schematic structural diagram of a pixel driving circuit in a display panel provided by an embodiment of the application.

The description of the following embodiments and reference to the drawings are used to illustrate specific embodiments that can be implemented in this application. The directional terms mentioned in this application, such as "above", "below", "front", "back", "left", "right", "inner", "outer", "side", etc., only refer to directions of the attached drawings. Therefore, the directional terms are used to illustrate and understand the application, rather than to limit the application. In the figure, units with similar structures are denoted by the same reference numerals.

The embodiments of the present application provide a display panel and a display device to alleviate the technical problem of poor stability of the pixel driving circuit in the current display panel.

As shown in FIG. 1, the present application provides a display panel, which includes a plurality of light-emitting devices D1 arranged in an array and a pixel driving circuit for driving the light-emitting devices D1 to emit light. The pixel driving circuit includes: a first initialization transistor T4 configured to input an initialization signal VI to a first node Q under control of a first scan signal Scan 1; a switching transistor T2 configured to input a data signal Vdata to a second node A under control of a second scan signal Scan 2; a driving transistor T1 configured to drive the light-emitting device D1 to emit light under control of potentials of the first node Q and the second node A; a compensation transistor T3 connected to the driving transistor T1 through the first node Q and a third node B, and configured to compensate a threshold voltage of the driving transistor T1 under control of a third scan signal Scan 3; a second initialization transistor configured to input an initialization signal to an anode of the light-emitting device under control of the third scan signal; a first light-emitting control transistor T5 connected to the driving transistor T1 through the second node A, and configured to conduct a current from a power supply high-potential signal line to the driving transistor T1 under control of a light-emitting control signal EM; a second light-emitting control transistor T6 connected to the driving transistor T1 through the third node B, and configured to conduct a current from the driving transistor T1 to the anode C of the light-emitting device D1 under control of the light-emitting control signal EM; a storage capacitor C1, connected to the driving transistor T1 through the first node Q, connected to the power supply high-potential signal line through a fourth node D, and configured to store the data signal Vdata; wherein the compensation transistor T3, the first initialization transistor T4, and the second initialization transistor T7 are oxide transistors, and the switching transistor T2, the driving transistor T1, the first light-emitting control transistor T5, and the second light-emitting control transistor T6 are low-temperature polysilicon transistors.

Specifically, a gate of the first initialization transistor T4 is input with a first scan signal Scan 1, the first electrode is input with an initialization signal VI, and the second electrode is connected to the first node Q.

A gate of the switching transistor T2 is input with a second scan signal Scan 2, the first electrode is input with the data signal Vdata, and the second electrode is connected to the second node A.

A gate of the driving transistor T1 is connected to the first node Q, the first electrode is connected to the second node A, and the second electrode is connected to the third node B.

A gate of the compensation transistor T3 is input with a third scan signal Scan 3, the first electrode is connected to the third node B, and the second electrode is connected to the first node Q.

A gate of the second initialization transistor T7 is input with the third scan signal Scan 3, the first electrode is input with the initialization signal VI, and the second electrode is connected to the anode C of the light-emitting device D1.

A gate of the first light-emitting control transistor T5 is input with a light-emitting control signal EM, the second electrode is input with a power supply high-potential signal Vdd, and the first electrode is connected to the second node A.

A gate of the second light-emitting control transistor T6 is input with the light-emitting control signal EM, the first electrode is connected to the third node B, and the second electrode is connected to the anode C of the light-emitting device D1.

A first electrode plate of the storage capacitor C1 is input with the power supply high-potential signal Vdd, and the second electrode plate is connected to the first node Q.

In the transistors T1 to T7, one of the first electrode and the second electrode is a source electrode, and the other are drain electrodes.

Figure 2:
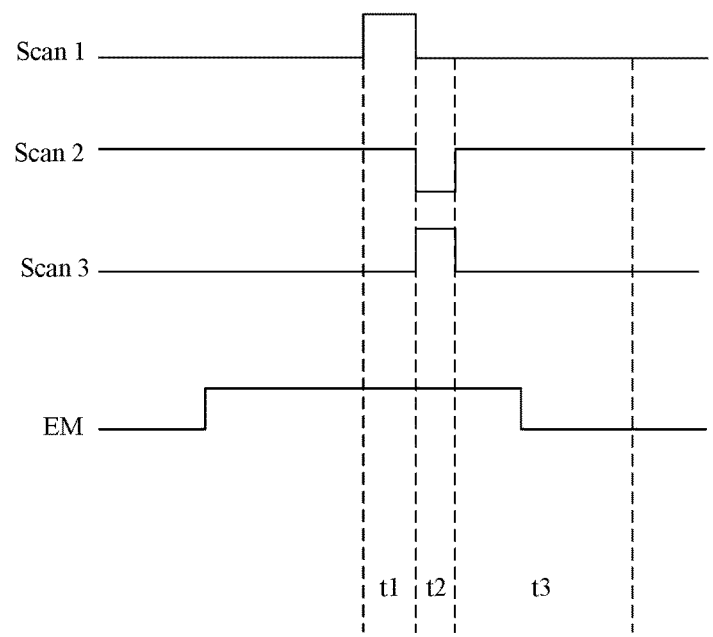
FIG. 2 is a timing diagram of signals of the pixel driving circuit in the display panel provided by an embodiment of the application.

FIG. 2 shows a timing diagram of a pixel driving circuit of this application in the display phase. In the pixel driving circuit of the present application, a compensation transistor T3, a first initialization transistor T4, and a second initialization transistor T7 are N-type transistors, and a switching transistor T2, a driving transistor T1, a first light-emitting control transistor T5, and a second light-emitting control transistor T6 are P-type transistors.

In reset phase t1, the second scan signal Scan 2 is at a high potential, the switching transistor T2 is turned off. The third scan signal Scan 3 is at a low potential, the compensation transistor T3 and the second initialization transistor T7 are turned off. The light-emitting control signal EM is at a high potential, and the first light-emitting control signal T5 and the second light-emitting control signal T6 are turned off. The first scan signal Scan 1 is at a high potential, the first initialization transistor T4 is turned on, and the initialization signal is input to the first node Q to pull the potential of the first node Q down.

In data write-in phase t2, the first scan signal Scan 1 is at a low potential, the first initialization transistor T4 is turned off. The second scan signal Scan 2 is at a low potential, the switching transistor T2 is turned on. The third scan signal Scan 3 is at a high potential, the compensation transistor T3 and the second initialization transistor T7 are turned on. Since the potential of the first node Q is low, the gate of the driving transistor T1 and the second electrode are short-circuited after the compensation transistor T3 is turned on. A voltage difference is generated between the gate electrode and the first electrode of the driving transistor T1 through the threshold voltage of the driving transistor T1. At this time, the driving transistor T1 is turned on, and the switching transistor T2 inputs the data signal Vdata to the second node A. The data signal Vdata includes compensated threshold voltage and is input to the gate of the driving transistor T1, thereby compensating for the threshold voltage deviation of the driving transistor T1. The written data signal Vdata charges the first node Q through the driving transistor T1 until the voltage of the first node Q becomes Vdata−Vth, and the driving transistor T1 is turned off. In addition, since the second initialization transistor T7 is turned on, the anode of the light-emitting device D1 receives the initialization signal and is reset.

In light-emitting phase t3, the light-emitting control signal EM is at a low potential, the first light-emitting control signal T5 and the second light-emitting control signal T6 are turned on, so as to conduct the current from the power supply high-potential signal line VDD to the driving transistor T1 and conduct the current from the driving transistor T1 to the anode C of the light-emitting device D1. At this time, the driving current flowing through the light-emitting device D1 satisfies the following formula: $I=\frac{1}{2}K[Vdd-(Vdata-Vth)-Vth]^2=\frac{1}{2}K[Vdd-Vdata]^2$. The light-emitting device D1 emits light under the action of the driving current I.

In the embodiment of the present application, the compensation transistor T3, the first initialization transistor T4, and the second initialization transistor T7 are oxide transistors, and the switching transistor T2, the driving transistor T1, the first light-emitting control transistor T5, and the second light-emitting control transistor T6 are low-temperature polysilicon transistors. In light-emitting phase t3, taking advantage of the low leakage current characteristics of the oxide thin film transistor, the compensation transistor T3 can keep the potentials of the first node Q and the third node B stable, the first initialization transistor T4 can keep the potential of the first node Q stable, and the second initialization transistor T7 can keep the potential of the anode C of the light-emitting device D1 stable. It can alleviate the problem of light-emitting brightness changes caused by the leakage current of the light-emitting device D1, and can especially alleviate the problem of poor display effect at a lower refresh frequency. Simultaneously, by utilizing the characteristics of high mobility and high driving speed of low-temperature polysilicon transistors, in data write-in phase t2, the response speed of the switching transistor T2 and the driving transistor T1 is faster, so that data can be written quickly, preventing insufficient charging due to a long turn-on time, and in light-emitting phase t3, the response speed of first light-emitting control transistor T5 and the second light-emitting control transistor T6 is faster, so that the driving current I quickly flows into the light-emitting device D1, so as to prevent the display image lag caused by the slow turn-on speed. This application uses a pixel driving circuit that combines low-temperature polysilicon transistors and oxide transistors and utilizes the high mobility and faster driving speed of low-temperature polysilicon transistors, as well as the low leakage current characteristics of oxide transistors, which can make the display effect of the display panel more stable and make its power consumption less.

Figure 3:
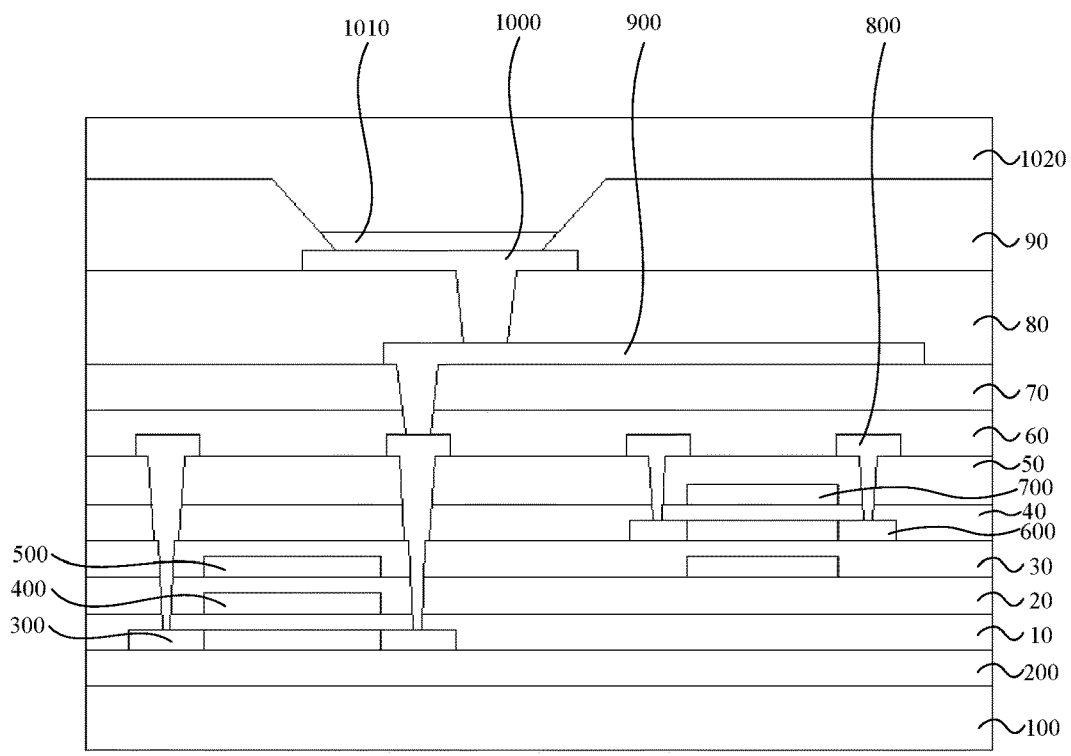
FIG. 3 is a schematic diagram of a structure of film layers in the display panel provided by an embodiment of the application.

As shown in FIG. 3, it is a schematic diagram of a film layer structure of a display panel provided by an embodiment of the application. The display panel includes a substrate 100, a first semiconductor layer 300, a first metal layer 400, a second metal layer 500, a second semiconductor layer 600, a third metal layer 700, a first source and drain layer 800, and a second source and drain layer 900, stacked from bottom to top, wherein the first semiconductor layer 300 forms the polysilicon active layer of each low-temperature polysilicon transistor, and the second semiconductor layer 600 forms the oxide active layer of each oxide transistor.

Figure 4:
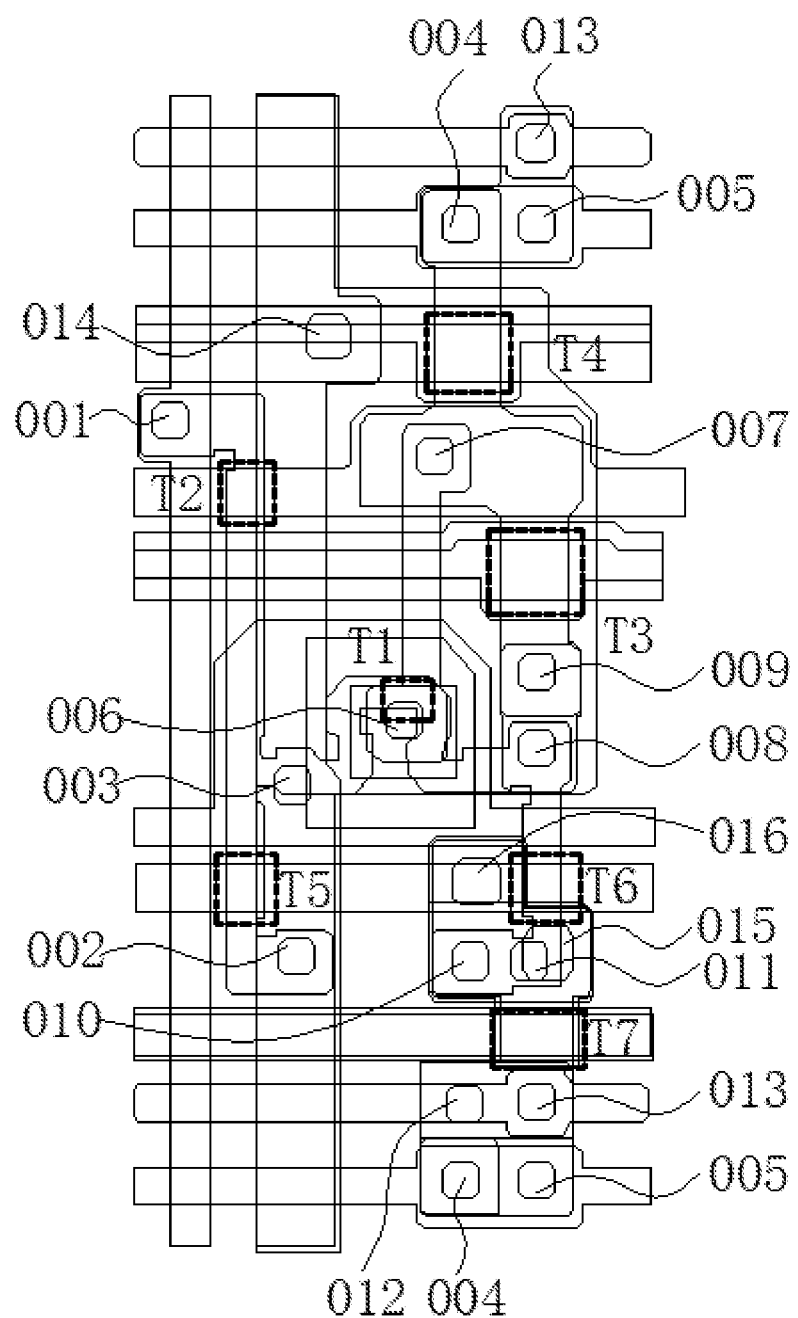
FIG. 4 is a schematic diagram of a planar superimposed structure of film layers in the display panel provided by an embodiment of the application.

In FIG. 3, the left side shows a film layer structure of a low-temperature polysilicon transistor, and the right side shows a film layer structure of an oxide transistor. The structures of the switching transistor T2, the driving transistor T1, the first light-emitting control transistor T5, and the second light-emitting control transistor T6 in the pixel driving circuit are all the same as the structure of the transistor on the left side of FIG. 3. The structures of the compensation transistor T3, the first initialization transistor T4, and the second initialization transistor T7 are all the same as the structure of the transistor on the right side of FIG. 3. FIG. 4 is a schematic plan view of superimposed film layers in the display panel provided by an embodiment of the application, and FIG. 5 to FIG. 11 are respectively schematic plan views of each film layer. The film layer structure of each transistor in the pixel driving circuit will be specifically described below with reference to FIG. 3 to FIG. 11.

As shown in FIG. 3, the substrate 100 may include a rigid substrate or a flexible substrate. When the substrate 100 is a rigid substrate, the material can be metal or glass. When the substrate 100 is a flexible substrate, the material may include at least one of acrylic resin, methacrylic resin, polyisoprene, vinyl resin, epoxy resin, polyurethane resin, cellulose resin, siloxane resin, polyimide resin, or polyamide resin. The application does not limit the material of the substrate 100.

A buffer layer 200 is usually formed on the substrate 100, the buffer layer 200 may include an inorganic material, such as at least one of silicon nitride or silicon oxide, to prevent foreign impurities under the substrate 100 from diffusing into the upper transistor, and improve the bonding strength between the substrate 100 and the film layer above it.

Depending on the type of substrate 100, process conditions, etc., the buffer layer 200 may be omitted.

Figure 5:
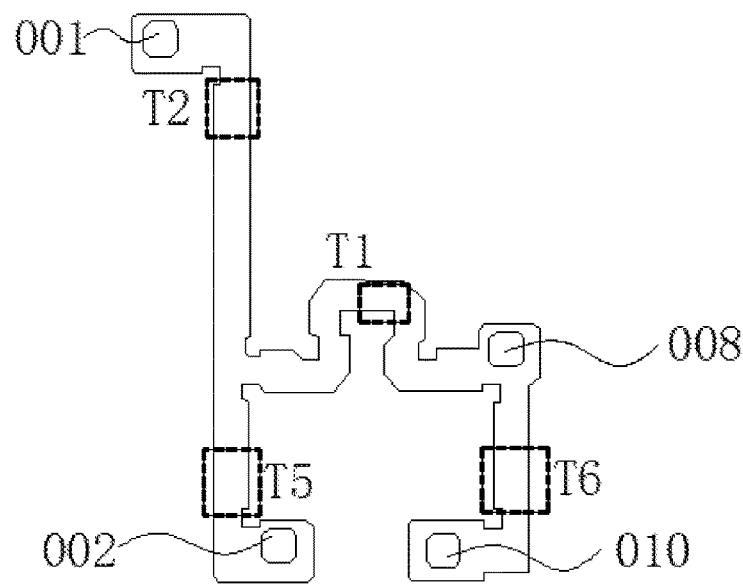
FIG. 5 is a schematic diagram of a planar structure of a first semiconductor layer in the display panel provided by an embodiment of the application.
Figure 6:
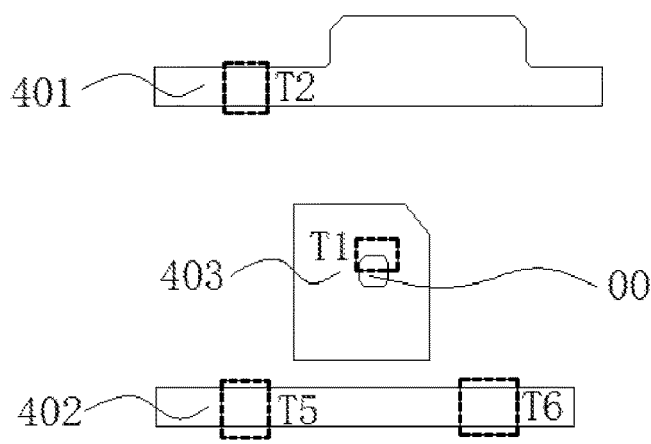
FIG. 6 is a schematic diagram of a planar structure of a first metal layer in the display panel provided by an embodiment of the application.

As shown in FIG. 3, FIG. 4, and FIG. 5, the first semiconductor layer 300 is patterned to form the polysilicon active layer of the switching transistor T2, the driving transistor T1, the first light-emitting control transistor T5, and the second light-emitting control transistor T6. The polysilicon active layer of each transistor is connected to each other, and the polysilicon active layer can be formed by crystallizing amorphous silicon. The crystallization method can include rapid thermal annealing (RTA), solid-phase crystallization (SPC), excimer laser annealing (ELA), metal-induced crystallization (MIC), metal-induced lateral crystallization (MILC), and sequential lateral solidification (SLS), etc.

As shown in FIG. 3, a first gate insulating layer 10 is formed on the first semiconductor layer 300, and the material of the first gate insulating layer 10 includes silicon oxide.

As shown in FIG. 3, FIG. 4, FIG. 5, and FIG. 6. The first metal layer 400 is formed on the first gate insulating layer 10 and is patterned to form a plurality of first-layer scan signal lines and the first electrode plate 403 of the storage capacitor. The first-layer scan signal lines specifically include a first scan signal line 401 and a second scan signal line 402, wherein the second scan signal line 402 is a light-emitting control signal line. Wherein, projections of the first scan signal line 401 and the polysilicon active layer on the substrate 100 have an intersection area, a portion of the first scan signal line 401 positioned in the intersection area forms a gate of the switching transistor T2, and a portion of the polysilicon active layer positioned in the intersection area forms a channel region of the switching transistor T2. Projections of the second scan signal line 402 and the polysilicon active layer on the substrate 100 have an intersection area, a portion of the second scan signal line 402 positioned in the intersection area respectively forms a gate of the first light-emitting control transistor T5 and a gate of the second light-emitting control transistor T6, and a portion of the polysilicon active layer positioned in the intersection area respectively forms a channel region of the first light-emitting control transistor T5 and a channel region of the second light-emitting control transistor T6. Projections of the first electrode plate 403 of the storage capacitor and the polysilicon active layer on the substrate 100 also have an intersection area, a portion of the first electrode plate 403 of the storage capacitor positioned in the intersection area forms a gate of the driving transistor T1, and a portion of the polysilicon active layer positioned in the intersection area forms a channel region of the driving transistor T1.

Ion doping is performed on a portion of the polysilicon active layer except for the aforementioned channel regions to form source and drain regions of each low-temperature polysilicon transistor. Through ion doping and the intersecting arrangement of the first-layer scan signal lines, the connection between the second electrode of the switching transistor T2 and the second electrode of the first light-emitting control transistor T5 and the first electrode of the driving transistor T1, and the connection between the second electrode of the driving transistor T1 and the first electrode of the second light-emitting control transistor T6 are realized.

The material of the first metal layer 400 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), or tungsten (W).

As shown in FIG. 3, a second gate insulating layer 20 is formed on the first metal layer 400, and the material of the second gate insulating layer 20 includes silicon nitride.

Figure 7:
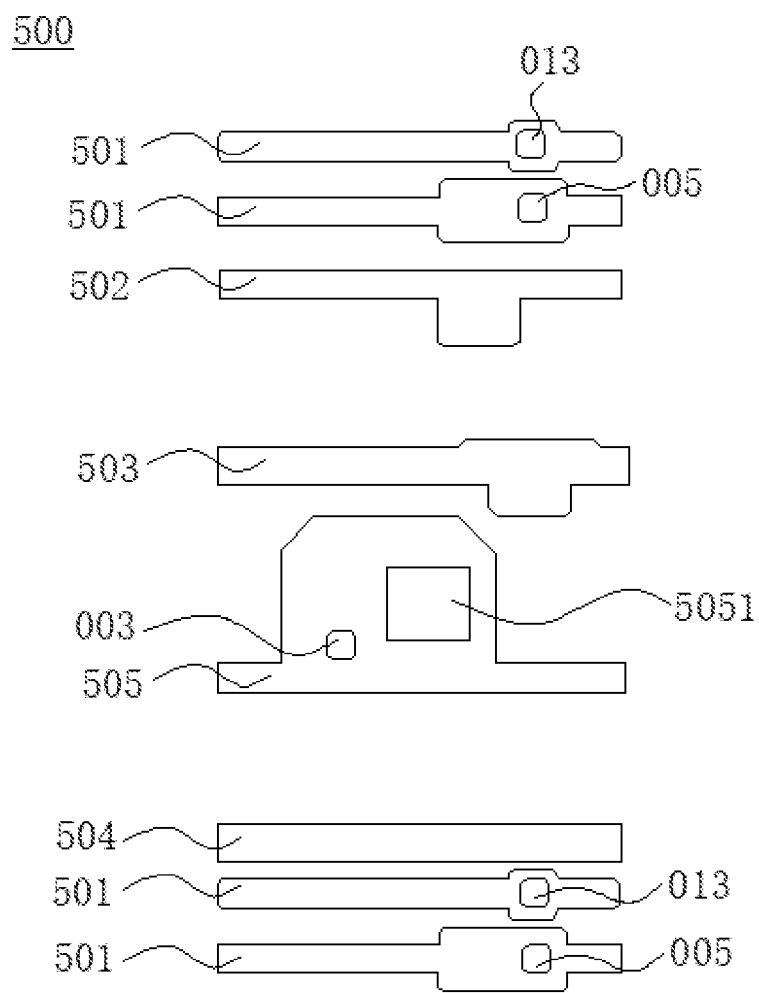
FIG. 7 is a schematic diagram of a planar structure of a second metal layer in the display panel provided by an embodiment of the application.

As shown in FIG. 3, FIG. 4, and FIG. 7, the second metal layer 500 is formed on the second gate insulating layer 20, which is patterned to form a plurality of second-layer scanning signal lines and second electrode plates 505 of storage capacitors. The second-layer scanning signal lines specifically include a third scanning signal line 501, a fourth scanning signal line 502, a fifth scanning signal line 503, and a sixth scanning signal line 504, wherein the third scanning signal line 501 is an initialization signal line VI. It should be noted that in FIG. 7 the top third scan signal line 501 is the scan signal line in the pixel driving circuit corresponding to the previous light-emitting device, and the bottom third scan signal line 501 is the scan signal line in the pixel driving circuit corresponding to the next light-emitting device.

The material of the second metal layer 500 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), or tungsten (W).

As shown in FIG. 3, a first interlayer dielectric layer 30 is formed on the second metal layer 500, and the material includes at least one of silicon nitride or silicon oxide.

Figure 8:
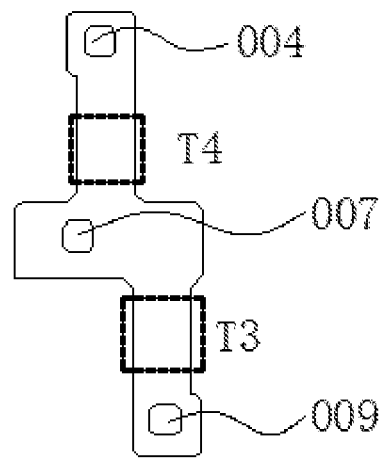
FIG. 8 is a schematic diagram of a planar structure of a second semiconductor layer in the display panel provided by an embodiment of the application.
Figure 8:
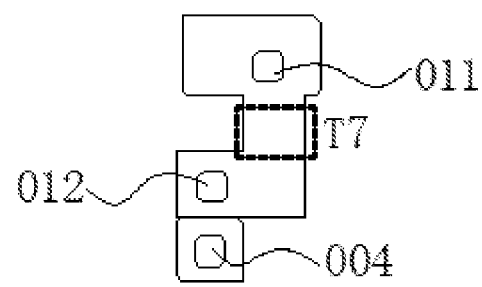

As shown in FIG. 3, FIG. 4, and FIG. 8, the second semiconductor layer 600 is formed on the first interlayer dielectric layer 30 and is patterned to form oxide active layers of the compensation transistor T3, the first initialization transistor T4, and the second initialization transistor T7, wherein the oxide active layers of the compensation transistor T3 and the first initialization transistor T4 are connected to each other, and the oxide active layer of the second initialization transistor T7 is independent of other transistors. The material of the oxide active layer may include at least one of zinc oxide (ZnO), zinc tin oxide (ZTO), zinc indium oxide (ZIO), indium oxide (InO), titanium oxide (TiO), indium gallium zinc oxide (IGZO), or indium zinc tin oxide (IZTO).

As shown in FIG. 3, a third gate insulating layer 40 is formed on the second semiconductor layer 600, and the material of the third gate insulating layer 40 includes silicon oxide.

Figure 9:
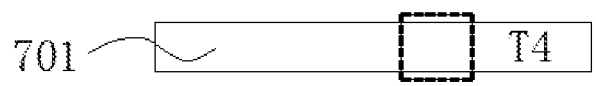
FIG. 9 is a schematic diagram of a planar structure of a third metal layer in the display panel provided by an embodiment of the application.
Figure 9:
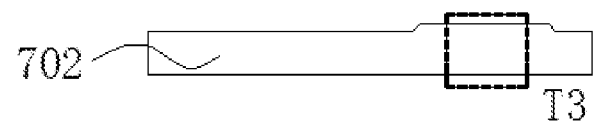
Figure 9:
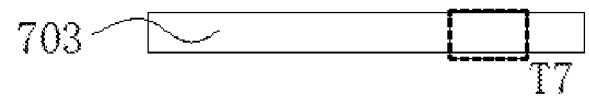

As shown in FIG. 3, FIG. 4, and FIG. 9. The third metal layer 700 is formed on the third gate insulating layer 40 and is patterned to form a plurality of third-layer scan signal lines, including a seventh scan signal line 701, an eighth scan signal line 702, and a ninth scan signal line 703. Wherein, projections of the seventh scan signal line 701 and the oxide active layer on the substrate 100 have an intersection area, a portion of the seventh scan signal line 701 positioned in the intersection area forms a top gate of the first initialization transistor T4, and a portion of the oxide active layer positioned in the intersection area forms a channel region of the first initialization transistor T4. Projections of the eighth scan signal line 702 and the oxide active layer on the substrate 100 have an intersection area, a portion of the eighth scan signal line 702 in the intersection area forms a top gate of the compensation transistor T3, and a portion of the oxide active layer positioned in the intersection area forms a channel region of the compensation transistor T3. Projections of the ninth scan signal line 703 and the oxide active layer on the substrate 100 also have an intersection area, a portion of the ninth scan signal line 703 positioned in the intersection area forms a top gate of the second initialization transistor T7, and a portion of the oxide active layer positioned in the intersection region forms a channel region of the second initialization transistor T7.

The portion of the oxide active layer except for the above-mentioned channel regions forms source regions and drain regions of each oxide transistor. Through the intersecting arrangement of third-layer scan signal lines, the connection between the second electrode of the compensation transistor T3 and the second electrode of the first initialization transistor T4 and the connection between the first electrode of the first initialization transistor T4 and the first electrode of the second initialization transistor T7 are realized.

The material of the third metal layer 700 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), or tungsten (W).

As shown in FIG. 3, a second interlayer dielectric layer 50 is formed on the third metal layer 700, and the material includes at least one of silicon nitride or silicon oxide.

Figure 10:
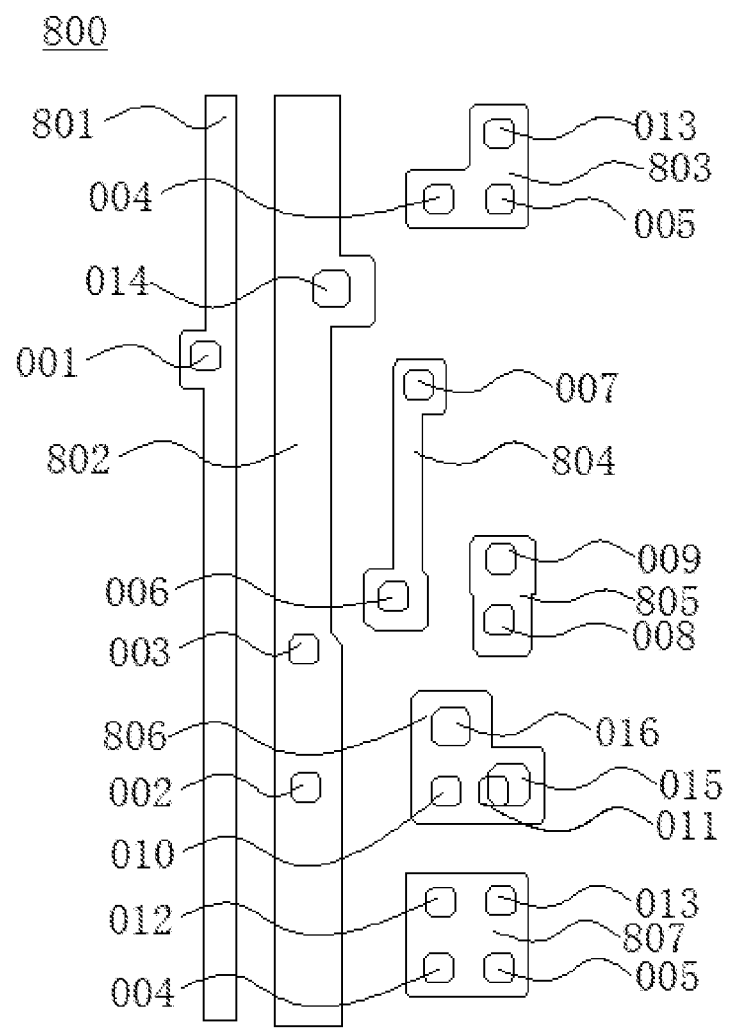
FIG. 10 is a schematic diagram of a planar structure of a first source and drain layer in the display panel provided by an embodiment of the application.

As shown in FIG. 3, FIG. 4, and FIG. 10. A first source and drain layer 800 is formed on the second interlayer dielectric layer 50 and is patterned to form a data signal line 801, a power supply high-potential signal line 802, a first connection line 803, a second connection line 804, a third connection line 805, a fourth connection line 806, and a fifth connection line 807. The material of the first source and drain layer 800 includes at least one metal or an alloy selected from Mo, Al, Cu, Ti, or the like.

The data signal line 801 is connected to the polysilicon active layer of the switching transistor T2 through a first via-hole 001. The power supply high-potential signal line 802 is connected to the polysilicon active layer of the first light-emitting control signal line T5 through a second via-hole 002, is connected to the first electrode plate 505 of the storage capacitor C1 through a third via-hole 003, and the connection needs to pass through a capacitor via-hole 5051 formed in the second electrode plate 505 of the storage capacitor. The first connection line 803 is connected to the oxide active layer of the first initialization transistor T4 through a fourth via-hole 004 to form a first electrode of the first initialization transistor T4, and then is connected to the initialization signal line VI through a fifth via-hole 005. The second connection line 804 is connected to a gate of the driving transistor T1 and a second electrode plate 403 of the storage capacitor C1 through a sixth via-hole 006, and is connected to an oxide active layer of the first initialization transistor T4 through a seventh via-hole 007, to form a second electrode of the first initialization transistor T4. The third connection line 805 is connected to a polysilicon active layer of the driving transistor T1 and a second light-emitting control transistor T6 through an eighth via-hole 008 to form a second electrode of the driving transistor T1 and a first electrode of the second light-emitting control transistor T6, and is connected to an oxide active layer of the compensation transistor T3 through a ninth via-hole 009 to form a second electrode of the compensation transistor T3. The fourth connection line 806 is connected to a polysilicon active layer of the second light-emitting control transistor T6 through a tenth via-hole 010 to form a second electrode of the second light-emitting control transistor T6, and is connected to an oxide active layer of the second initialization transistor T7 through an eleventh via-hole 011 to form a second electrode of the second initialization transistor T7. The fifth connection line 807 is connected to an oxide active layer of the second initialization transistor T7 through a twelfth via-hole 012 to form a first electrode of the second initialization transistor T7, and is connected to an initialization signal line VI through a thirteenth via-hole 013.

As shown in FIG. 3, a passivation layer 60 is formed on the third metal layer 800, and the material of the passivation layer is usually selected from at least one of silicon nitride ($SiN_x$) or silicon oxide ($SiO_x$). A first planarization layer 70 is formed on the passivation layer 60, and the material of the first planarization layer 70 is usually selected from polyimide.

Figure 11:
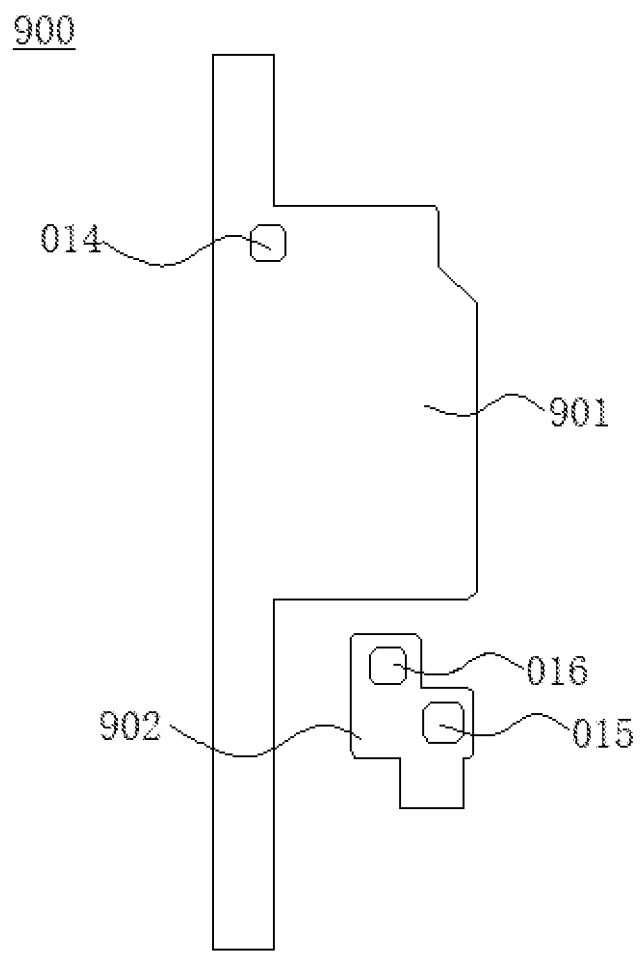
FIG. 11 is a schematic diagram of a planar structure of a second source and drain layer in the display panel provided by an embodiment of the application.

As shown in FIG. 3, FIG. 4, and FIG. 11, a second source and drain layer 900 is formed on the passivation layer 70. The material of the second source and drain layer 900 includes at least one metal or an alloy selected from Mo, Al, Cu, Ti, or the like.

The second source and drain layer 900 is patterned to form a first blocking member 901, the first blocking member 901 is connected to a power supply high-potential signal line 802, and a projection of the first blocking member 901 on the first metal layer 400 covers at least part of the first electrode plate 403 of the storage capacitor. The first blocking member 901 is connected to the power supply high-potential signal line 802 through a fourteenth via-hole 014. Since the projection of the first blocking member 901 on the first metal layer 400 covers at least a part of an area of the first electrode plate 403 of the storage capacitor, corresponding to the coverage area, a coupling capacitor can be generated between the first blocking member 901 and the first electrode plate 403 of the storage capacitor. The coupling capacitor and the storage capacitor are superimposed so that the ability of the circuit to store charges is increased. The first electrode plate 403 of the storage capacitor serves as a gate of the driving transistor T1. Therefore, the first blocking member 901 can improve the stability of the gate (i.e. the first node Q) of the driving transistor T1. Even if leakage current is generated in the circuit, it can be released by the coupling capacitor to reduce the influence of the leakage current, so that the brightness of the light-emitting device D1 changes less, and the stability of the pixel driving circuit is improved. When the projection of the first blocking member 901 on the first metal layer 400 covers the entire area of the first electrode plate 403 of the storage capacitor, the coupling capacitance generated is largest, and the effect of improving the stability is best.

The projection of the first blocking member 901 on the oxide active layer covers a channel region of the compensation transistor T3 and a channel region of the first initialization transistor T4. Since the oxide active layer is more sensitive to light, and the material of the first blocking member 901 is an opaque metal, it can block the ambient light incident from a side of the first blocking member 901 away from the oxide active layer, and prevent it from causing interference to the compensation transistor T3 and the first initialization transistor T4, thereby improving the stability of each oxide transistor.

In addition, since the material of the first blocking member 901 is metal, it can be used as a hydrogen barrier layer to prevent the influence of hydrogen ions generated in the process of the upper film layer on the oxide active layer and prevent causing the threshold voltage of the oxide transistor to drift. Therefore, the stability of the circuit is further improved.

As described above, the first blocking member 901 corresponds to the driving transistor T1, the compensation transistor T3, and the first initialization transistor T4 can simultaneously function as a light-shielding layer, a hydrogen barrier layer, and a coupling capacitor to improve the stability of the pixel driving circuit. The manufacturing process is simple and the cost is less.

The second source and drain layer 900 is further patterned to form a second blocking member 902, the second blocking member 902 forms a second drain of the second light-emitting control transistor T6, is connected to the second electrode of the second light-emitting control transistor T6 through a fifteenth via-hole 015, and is connected to the anode of the light-emitting device D1 through a sixteenth via-hole 016. The projection on the oxide active layer covers the channel region of the second initialization transistor T7. Similarly, the second blocking member 902 can block the ambient light incident from a side of the second blocking member 902 away from the oxide active layer, preventing it from causing interference to the second initialization transistor T7, and improving the stability of the second initialization transistor T7. The second blocking member 902 can also be used as a hydrogen barrier layer to prevent the influence of hydrogen ions generated in the manufacturing process of the film layer above it on the oxide active layer and further improve the stability of the circuit. As described above, the second blocking member 902 can simultaneously serve as a second drain, a light-shielding layer, and a hydrogen blocking layer of the second light-emitting control transistor T6, which together improve the stability of the pixel driving circuit, the manufacturing process is simple, and the cost is less.

As shown in FIG. 3, a second planarization layer 80 is formed on the second source and drain layer 900, and the material of the second planarization layer 80 is usually polyimide. The anode 1000 of the light-emitting device is formed in the second planarization layer 80 and includes a single layer or a stacked layer of conductive material with a high power function and a reflective material. The conductive material of high power function may include indium tin oxide (ITO), indium zinc oxide (IZO), zinc oxide (ZnO), or indium oxide ($In_2O_3$), etc. The reflective material may include silver (Ag), magnesium (Mg), aluminum (Al), platinum (Pt), palladium (Pd), gold (Au), nickel (Ni), neodymium (Nd), iridium (Ir), lithium (Li), calcium (Ca), or a mixture thereof. The pixel defining layer 90 is formed on the anode 1000 of the light-emitting device and includes a plurality of opening regions exposing the anode 1000. The material of the pixel defining layer 90 may include photoresist, polyimide resin, acrylic resin, silicon compound, or polyacrylic resin, etc.

The organic light-emitting layer 1010 is formed in the opening area, and the cathode of the light-emitting device (not shown) is positioned on the organic light-emitting layer 1010 and extends to cover the pixel defining layer 90. The anode 1000, the organic light-emitting layer 1010, and the cathode together constitute a light-emitting device. In this application, the display panel is an organic light-emitting diode (OLED) display panel, and the light-emitting device is an OLED light-emitting device. The top layer is the encapsulation layer 1020, the material of which includes a combination of organic material and inorganic material.

In one embodiment, the projection of the polysilicon active layer at least partially overlaps the projection of the oxide active layer on the substrate 100. In the pixel driving circuit of the prior art, each transistor is a low-temperature polysilicon transistor, and the active layer of each transistor is arranged in the same layer and connected to each other, so it occupies a large space. In the pixel driving circuit of the present application, the polysilicon active layer and the oxide active layer are arranged in different layers, and their projections on the substrate 100 at least partially overlap. Therefore, the occupied space can be reduced, so that an entire pixel driving circuit occupies a smaller area, thus reducing an area of the opaque region, increasing the light transmittance of the display panel, and improving the display effect.

In one embodiment, a plurality of second-layer scan signal lines correspond to the channel regions of each oxide transistor form the bottom gate of each oxide transistor, and the projection of the channel region on the substrate 100 falls within the projection range of the corresponding bottom gate on the substrate 100. Since the oxide active layer is more sensitive to light, and the material of the second metal layer 500 is an opaque metal, and the projection of the channel region on the substrate 100 falls within the projection range of the corresponding bottom gate on the substrate 100, it can block the ambient light incident from a side of the second metal layer 500 away from the oxide active layer and prevent it from causing interference to each oxide transistor, thereby improving the stability of each oxide transistor.

In one embodiment, the plurality of second-layer scan signal lines are input with variable voltages when the oxide transistors are operating, so as to adjust the threshold voltages of the corresponding oxide transistors. Since oxide transistors will have threshold voltage drift after long-term use, the threshold voltage will have a positive or negative bias, so that the written data signal cannot be displayed correctly. At this time, a potential signal can be input to the bottom gate of each oxide transistor to correct the threshold voltage drift and stabilize the driving current flowing through the light-emitting device D1. Since the threshold voltage will drift to varying degrees depending on the length of time, it is possible to input a variable voltage during the operation of the oxide transistor after detecting the magnitude of the threshold voltage drift, so the effect of adjusting the threshold voltage is more accurate, and the stability of the circuit is better.

In addition, since the material of the second metal layer 500 is metal, it can be used as a hydrogen barrier layer to prevent the influence of hydrogen ions generated in the manufacturing process of the underlying film layer on the oxide active layer, and prevent the threshold voltage of the oxide transistor to drift. Therefore, the stability of the circuit is further improved.

As described above, the second metal layer 500 forms bottom gates corresponding to each oxide transistor, which can simultaneously function as a light-shielding layer, a hydrogen barrier layer, and threshold voltage adjustment, and improve the stability of the pixel driving circuit. In addition, the manufacturing process is simple and the cost is less.

It can be seen from the above-mentioned embodiments that the pixel driving circuit of the present application configures the compensation transistor T3, the first initialization transistor T4, and the second initialization transistor T7 as oxide transistors, and improves the structure of each film layer, which together improve the stability of the pixel drive circuit and improve the display effect.

The present application further provides a display device, including a display panel and a driving chip, the display panel is any of the above-mentioned display panels. By configuring the compensation transistor T3, the first initialization transistor T4, and the second initialization transistor T7 in the display panel as oxide transistors, and improving the structure of each film layer, the stability of the pixel driving circuit is improved, and the display effect is improved.

This application also provides a display device. The specific structure can be seen in FIG. 1. The display device includes: a first initialization transistor T4 configured to input an initialization signal VI to a first node Q under control of a first scan signal Scan 1; a switching transistor T2 configured to input a data signal Vdata to a second node A under control of a second scan signal Scan 2; a driving transistor T1 configured to drive the light-emitting device D1 to emit light under control of potentials of the first node Q and the second node A; a second initialization transistor T7 configured to input an initialization signal VI to an anode of the light-emitting device under control of the third scan signal Scan 3; wherein the first initialization transistor T4 and the second initialization transistor T7 are oxide transistors, and the switching transistor T2 and the second initialization transistor T7 are different types of transistors.

In one embodiment, the switching transistor T2 is a low-temperature polysilicon transistor and is a P-type transistor, and the first initialization transistor T4 and the second initialization transistor T7 are N-type transistors.

FIG. 2 shows a timing diagram of various signals of the display device in the display phase. In the embodiment of the present application, the first initialization transistor T4 and the second initialization transistor T7 are oxide transistors, and the switching transistor T2 is a low-temperature polysilicon transistor. In light-emitting phase t3, taking advantage of the low leakage current characteristics of the oxide thin film transistor, the first initialization transistor T4 can keep the potential of the first node Q stable, and the second initialization transistor T7 can keep the potential of the anode C of the light-emitting device D1 stable, which can alleviate the problem of light-emitting brightness changes caused by the leakage current of the light-emitting device D1, and can especially alleviate the problem of poor display effect at a lower refresh frequency. Simultaneously, by utilizing characteristics of high mobility and high driving speed of low-temperature polysilicon transistors, in data write-in phase t2, the response speed of the switching transistor T2 is faster, so that data can be written quickly, preventing insufficient charging due to a long turn-on time. This application uses a pixel driving circuit that combines low-temperature polysilicon transistors and oxide transistors and utilizes the high mobility and faster driving speed of low-temperature polysilicon transistors, as well as the low leakage current characteristics of oxide transistors, which can make the display effect of the display panel more stable and make its power consumption less.

As shown in FIG. 3 to FIG. 11, the display device of the present application includes a substrate 100, a first semiconductor layer 300, a first metal layer 400, a second metal layer 500, a second semiconductor layer 600, a third metal layer 700, a first source and drain layer 800, and a second source and drain layer 900, which are stacked from bottom to top, wherein the first semiconductor layer 300 forms the polysilicon active layer of each low-temperature polysilicon transistor, and the second semiconductor layer 600 forms the oxide active layer of each oxide transistor.

In one embodiment, the projection of the polysilicon active layer at least partially overlaps the projection of the oxide active layer on the substrate 100. In the display device of the prior art, each transistor is a low-temperature polysilicon transistor, and the active layer of each transistor is arranged in the same layer and connected to each other, thus occupying a large space. In the display device of the present application, the polysilicon active layer and the oxide active layer are arranged in different layers, and their projections at least partially overlap on the substrate 100, so that the occupied space can be reduced and the entire pixel driving circuit occupies a smaller area, thus reducing the area of the opaque area, and the light transmittance of the display device is increased, and the display effect is improved.

In one embodiment, the projection of the channel region of each oxide transistor on the substrate 100 falls within the projection range of the corresponding bottom gate on the substrate 100. Since the oxide active layer is more sensitive to light, and the material of the second metal layer 500 is an opaque metal, and the projection of the channel region on the substrate 100 falls within the projection range of the corresponding bottom gate on the substrate 100. Therefore, the ambient light incident from the side of the second metal layer 500 away from the oxide active layer can be blocked, preventing it from causing interference to each oxide transistor, and improving the stability of each oxide transistor.

In one embodiment, the second-layer scan signal line inputs a variable voltage when the oxide transistor is operating, so as to adjust the threshold voltage of the corresponding oxide transistor. Since oxide transistors will have threshold voltage drift when they are used for a long time, the threshold voltage will have a positive or negative bias, so that the written data signal cannot be displayed correctly. At this time, a potential signal can be input to the bottom gate of each oxide transistor to correct and adjust the threshold voltage drift, so that the driving current flowing through the light-emitting device D1 is stable. Since the threshold voltage will drift to varying degrees depending on the length of time, it is possible to input a variable voltage during the operation of the oxide transistor after detecting the magnitude of the threshold voltage drift, so the effect of adjusting the threshold voltage is more accurate, and the stability of the circuit is better.

In addition, since the material of the second metal layer 500 is metal, it can be used as a hydrogen barrier layer to prevent the influence of hydrogen ions generated in a manufacturing process of the underlying film layer on the oxide active layer, and prevent the threshold voltage of the oxide transistor to drift, which further improves the stability of the circuit.

In one embodiment, the display device further includes a storage capacitor C1. The first node Q of the storage capacitor C1 is connected to the driving transistor T1 and is connected to the power supply high-potential signal line through the fourth node D for storing the data signal Vdata. The first metal layer 400 is patterned to form the first electrode plate 403 of the storage capacitor C1, and the second metal layer 500 is patterned to form the second electrode plate 505 of the storage capacitor C1.

The first source and drain layer 800 is patterned to form a power supply high potential signal line 802, and the second source and drain layer 900 is patterned to form a first blocking member 901. The first blocking member 901 is connected to the power supply high-potential signal line 802, and the projection of the first blocking member 901 on the first metal layer 400 covers at least part of the first electrode plate 403 of the storage capacitor.

Since the projection of the first blocking member 901 on the first metal layer 400 covers at least a part of the area of the first electrode plate 403 of the storage capacitor, corresponding to the coverage area, a coupling capacitor can be generated between the first blocking member 901 and the first electrode plate 403 of the storage capacitor. The coupling capacitor and the storage capacitor are superimposed so that the ability of the circuit to store charges is increased. The first electrode plate 403 of the storage capacitor serves as a gate of the driving transistor T1. Therefore, the first blocking member 901 can improve the stability of the gate (i.e. the first node Q) of the driving transistor T1. Even if leakage current is generated in the circuit, it can be released by the coupling capacitor to reduce the influence of the leakage current, so that the brightness of the light-emitting device D1 changes less, and the stability of the pixel driving circuit is improved. When the projection of the first blocking member 901 on the first metal layer 400 covers the entire area of the first electrode plate 403 of the storage capacitor, the coupling capacitance generated is largest, and the effect of improving the stability is best.

The projection of the first blocking member 901 on the oxide active layer covers the channel region of the first initialization transistor T4. Since the oxide active layer is more sensitive to light, and the material of the first blocking member 901 is an opaque metal, it can block the ambient light incident from a side of the first blocking member 901 away from the oxide active layer, and prevent it from causing interference to the first initialization transistor T4, thereby improving the stability of each oxide transistor.

In addition, since the material of the second metal layer 500 is metal, it can be used as a hydrogen barrier layer to prevent the influence of hydrogen ions generated in a manufacturing process of the upper film layer on the oxide active layer, and prevent the threshold voltage of the oxide transistor to drift, which further improves the stability of the circuit.

As described above, the first blocking member 901 corresponds to the first initialization transistor T4 can simultaneously function as a light-shielding layer, a hydrogen barrier layer, and a coupling capacitor to improve the stability of the pixel driving circuit. The manufacturing process is simple and the cost is less.

In one embodiment, the display device further includes a first light-emitting control transistor T5 and a second light-emitting control transistor T6. The first light-emitting control transistor T5 is connected to the driving transistor T1 through the second node A and configured to conduct a current from a power supply high-potential signal line to the driving transistor T1 under control of a light-emitting control signal EM. The second light-emitting control transistor T6 is connected to the driving transistor T1 through the third node B, and configured to conduct a current from the driving transistor T1 to the anode C of the light-emitting device D1 under control of the light-emitting control signal EM. Wherein the driving transistor T1, the first light-emitting control transistor T5, and the second light-emitting control transistor T6 are polysilicon transistors. In data write-in phase t2, the response speed of the driving transistor T1 is faster, so that data can be written quickly, preventing insufficient charging due to a long turn-on time. In light-emitting phase t3, the response speed of the first light-emitting control transistor T5 and the second light-emitting control transistor is faster, so that the driving current I quickly flows into the light-emitting device D1, so as to prevent the display image lag caused by the slow turn-on speed.

The second source and drain layer 900 is further patterned to form a second blocking member 902, the second blocking member 902 forms a second drain of the second light-emitting control transistor T6, is connected to a second electrode of the second light-emitting control transistor T6 through a fifteenth via-hole 015, and is connected to an anode of the light-emitting device D1 through a sixteenth via-hole 016. The projection on the oxide active layer covers a channel region of the second initialization transistor T7. Similarly, the second blocking member 902 can block the ambient light incident from a side of the second blocking member 902 away from the oxide active layer, preventing it from causing interference to the second initialization transistor T7, and improving the stability of the second initialization transistor T7. The second blocking member 902 can also be used as a hydrogen barrier layer to prevent the influence of hydrogen ions generated in the manufacturing process of the film layer above it on the oxide active layer and further improve the stability of the circuit. As described above, the second blocking member 902 can simultaneously serve as a second drain, a light-shielding layer, and a hydrogen blocking layer of the second light-emitting control transistor T6, which improve the stability of the pixel driving circuit, the manufacturing process is simple, and the cost is less.

In one embodiment, the display device further includes a compensation transistor T3, the compensation transistor T3 is connected to the driving transistor T1 through the first node Q and the third node B and is configured to compensate the threshold voltage of the driving transistor T1 under control of the third scan signal Scan 3. The compensation transistor T3 is also an oxide transistor. In light-emitting phase t3, the compensation transistor T3 can keep the potentials of the first node Q and the third node B stable by utilizing the low leakage current characteristics of the oxide thin film transistor.

The projection of the first blocking member 901 on the oxide active layer covers the channel region of the compensation transistor T3. Therefore, the first blocking member 901 corresponds to the driving transistor T1, the compensation transistor T3, and the first initialization transistor T4 can simultaneously function as a light-shielding layer, a hydrogen blocking layer, and a coupling capacitor, which improve the stability of the pixel driving circuit, the manufacturing process is simple, and the cost is less.

Based on the above embodiments, it can be known that this application provides a display panel and a display device. The display panel includes a plurality of light-emitting devices arranged in an array and a pixel driving circuit that drives the light-emitting devices to emit light, and the pixel driving circuit includes: a first initialization transistor configured to input an initialization signal to a first node under control of a first scan signal; a switching transistor configured to input a data signal to a second node under control of a second scan signal; a driving transistor configured to drive the light-emitting device to emit light under control of potentials of the first node and the second node; a compensation transistor connected to the driving transistor through the first node and a third node, and configured to compensate a threshold voltage of the driving transistor under control of a third scan signal; a second initialization transistor configured to input an initialization signal to an anode of the light-emitting device under control of the third scan signal; a first light-emitting control transistor connected to the driving transistor through the second node, and configured to conduct a current from a power supply high-potential signal line to the driving transistor under control of a light-emitting control signal; a second light-emitting control transistor connected to the driving transistor through the third node, and configured to conduct a current from the driving transistor to the anode of the light-emitting device under control of the light-emitting control signal; a storage capacitor, connected to the driving transistor through the first node, connected to the power supply high-potential signal line through a fourth node, and configured to store the data signal; wherein the compensation transistor, the first initialization transistor, and the second initialization transistor are oxide transistors, the switching transistor, the driving transistor, the first light-emitting control transistor, and the second light-emitting control transistor are low-temperature polysilicon transistors. In this application, by using oxide transistors as compensation transistor, first initialization transistor, and second initialization transistor in the pixel driving circuit, and using low-temperature polysilicon transistors as other transistors, both low leakage current characteristics of oxide transistors and high mobility characteristics of low-temperature polysilicon transistors can be achieved, so that the pixel driving circuit is more stable and the display effect of the display panel is improved.

In the above-mentioned embodiments, the description of each embodiment has its own focus. For parts that are not described in detail in an embodiment, reference may be made to related descriptions of other embodiments.

The above describes a display panel and a display device in detail provided by embodiments of the present application. Specific examples are used to describe the principles and implementation of this application, and the description of the above examples is only used to help understand the technical solutions and core ideas of the application. Those of ordinary skill in the art should understand that they can still modify the technical solutions recorded in the foregoing embodiments, or equivalently replace some of the technical features. However, these modifications or replacements do not cause the essence of the corresponding technical solutions to deviate from the scope of the technical solutions of the embodiments of the present application.

What is claimed is:

1. A display panel, comprising a plurality of light-emitting devices arranged in an array and a pixel driving circuit configured to drive the light-emitting devices to emit light, wherein the pixel driving circuit comprises:
a first initialization transistor configured to input an initialization signal to a first node under control of a first scan signal;
a switching transistor configured to input a data signal to a second node under control of a second scan signal;
a driving transistor configured to drive the light-emitting devices to emit light under control of potentials of the first node and the second node;
a compensation transistor connected to the driving transistor through the first node and a third node, and configured to compensate a threshold voltage of the driving transistor under control of a third scan signal;
a second initialization transistor configured to input the initialization signal to an anode of the light-emitting devices under control of the third scan signal;
a first light-emitting control transistor connected to the driving transistor through the second node, and configured to conduct a current from a power supply high-potential signal line to the driving transistor under control of a light-emitting control signal;
a second light-emitting control transistor connected to the driving transistor through the third node, and configured to conduct a current from the driving transistor to the anode of the light-emitting devices under control of the light-emitting control signal; and
a storage capacitor, connected to the driving transistor through the first node, connected to the power supply high-potential signal line through a fourth node, and configured to store the data signal;
wherein the compensation transistor, the first initialization transistor, and the second initialization transistor are oxide transistors, and the switching transistor, the driving transistor, the first light-emitting control transistor, and the second light-emitting control transistor are low-temperature polysilicon transistors;
wherein the display panel comprises a substrate, a first semiconductor layer, a first metal layer, a second metal layer, a second semiconductor layer, a third metal layer, a first source-drain layer, and a second source-drain layer, stacked from bottom to top, the first semiconductor layer forms polysilicon active layers of each of the low-temperature polysilicon transistors, and the second semiconductor layer forms oxide active layers of each of the oxide transistors;
wherein the first metal layer is patterned to form a first electrode plate of the storage capacitor, and the second metal layer is patterned to form a second electrode plate of the storage capacitor; and
wherein the first source-drain layer is patterned to form the power supply high-potential signal line, the second source-drain layer is patterned to form a first blocking member, the first blocking member is connected to the power supply high-potential signal line, and a projection of the first blocking member on the first metal layer covers at least a part of an area of the first electrode plate of the storage capacitor.

2. The display panel according to claim 1, wherein the compensation transistor, the first initialization transistor, and the second initialization transistor are N-type transistors, and the switching transistor, the driving transistor, the first light-emitting control transistor, and the second light-emitting control transistor are P-type transistors.

3. The display panel according to claim 1, wherein a projection of the polysilicon active layers on the substrate at least partially overlaps a projection of the oxide active layers on the substrate.

4. The display panel according to claim 1, wherein the first metal layer is patterned to form a top gate of each of the oxide transistors, and the oxide active layers form a channel region of each of the oxide transistors, the second metal layer is patterned to form a bottom gate of each of the oxide transistors, and a projection of the channel region on the substrate falls within a projection range of a corresponding bottom gate on the substrate.

5. The display panel according to claim 1, wherein a projection of the first blocking member on the oxide active layers covers a channel region of the compensation transistor and a channel region of the first initialization transistor.

6. The display panel according to claim 1, wherein the second source-drain layer is patterned to form a second blocking member, the second blocking member is connected to the second light-emitting control transistor and the anode of the light-emitting devices, and a projection of the oxide active layers covers a channel region of the second initialization transistor.

7. A display device, comprising:
a first initialization transistor configured to input an initialization signal to a first node under control of a first scan signal;
a switching transistor configured to input a data signal to a second node under control of a second scan signal;
a driving transistor configured to drive a light-emitting device to emit light under control of potentials of the first node and the second node; and a second initialization transistor configured to input an initialization signal to an anode of the light-emitting device under control of a third scan signal;

wherein the first initialization transistor and the second initialization transistor are oxide transistors, and the switching transistor and the second initialization transistor are different types of transistors;

wherein the display device comprises a substrate, a first semiconductor layer, a first metal layer, a second metal layer, a second semiconductor layer, a third metal layer, a first source-drain layer, and a second source-drain layer, stacked from bottom to top, the first semiconductor layer forms polysilicon active layers of the low-temperature polysilicon transistor, and the second semiconductor layer forms oxide active layers of the oxide transistors;

wherein the display device further comprises a storage capacitor, the storage capacitor is connected to the driving transistor through the first node, is connected to a power supply high-potential signal line through a fourth node, and is configured to store the data signal, the first metal layer is patterned to form a first electrode plate of the storage capacitor, and the second metal layer is patterned to form a second electrode plate of the storage capacitor; and wherein the first source-drain layer is patterned to form the power supply high-potential signal line, the second source-drain layer is patterned to form a first blocking member, the first blocking member is connected to the power supply high-potential signal line, and a projection of the first blocking member on the first metal layer covers at least a part of an area of the first electrode plate of the storage capacitor.

8. The display device according to claim 7, wherein the switching transistor is a low-temperature poly silicon transistor.

9. The display device according to claim 8, wherein the switching transistor is a P-type transistor, and the first initialization transistor and the second initialization transistor are N-type transistors.

10. The display device according to claim 7, wherein a projection of the polysilicon active layers on the substrate at least partially overlaps a projection of the oxide active layers on the substrate.

11. The display device according to claim 7, wherein the second metal layer is patterned to form a bottom gate of each of the oxide transistors, the third metal layer is patterned to form a top gate of each of the oxide transistors, the oxide active layers form a channel region of each of the oxide transistors, and a projection of the channel region on the substrate falls within a projection range of a corresponding bottom gate on the substrate.

12. The display device according to claim 7, wherein a projection of the first blocking member on the oxide active layers covers a channel region of the first initialization transistor.

13. The display device according to claim 7, further comprising:
a first light-emitting control transistor connected to the driving transistor through the second node, and configured to conduct a current from a power supply high-potential signal line to the driving transistor under control of a light-emitting control signal; and
a second light-emitting control transistor connected to the driving transistor through a third node, and configured to conduct a current from the driving transistor to the anode of the light-emitting device under control of the light-emitting control signal;
wherein the driving transistor, the first light-emitting control transistor, and the second light-emitting control transistor are polysilicon transistors.

14. The display device according to claim 13, wherein the second source-drain layer is patterned to form a second blocking member, the second blocking member is connected to the second light-emitting control transistor and the anode of the light-emitting device, and a projection of the oxide active layers covers a channel region of the second initialization transistor.

* * * * *